United States Patent
Morris et al.

(10) Patent No.: US 10,637,403 B2
(45) Date of Patent: Apr. 28, 2020

(54) DIGITAL UPCONVERSION FOR MULTI-BAND MULTI-ORDER POWER AMPLIFIERS

(71) Applicant: Telefonaktiebolaget LM Ericsson (publ), Stockholm (SE)

(72) Inventors: Bradley John Morris, Ottawa (CA); Harpreet Panesar, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1 day.

(21) Appl. No.: 15/398,536

(22) Filed: Jan. 4, 2017

(65) Prior Publication Data
US 2017/0117852 A1    Apr. 27, 2017

Related U.S. Application Data

(63) Continuation of application No. 13/558,455, filed on Jul. 26, 2012, now Pat. No. 9,571,042.

(51) Int. Cl.
*H03F 1/02* (2006.01)
*H03L 7/00* (2006.01)
(Continued)

(52) U.S. Cl.
CPC ......... *H03F 1/0288* (2013.01); *H03F 1/0294* (2013.01); *H03F 1/3241* (2013.01);
(Continued)

(58) Field of Classification Search
CPC .... H03F 2200/387; H03F 3/211; H03F 3/193; H03F 3/213; H03F 2200/102;
(Continued)

(56) References Cited

U.S. PATENT DOCUMENTS

| 4,062,011 A | 12/1977 | Preston et al. |
| 4,363,061 A | 12/1982 | Vaerewyck et al. |

(Continued)

FOREIGN PATENT DOCUMENTS

| CN | 101490996 A | 7/2009 |
| GB | 2476393 A | 6/2011 |

(Continued)

OTHER PUBLICATIONS

Second Office Action for Chinese Patent Application No. 201380050424.2, dated Jun. 1, 2017, 21 pages.
(Continued)

*Primary Examiner* — David C Payne
*Assistant Examiner* — Sarah Hassan
(74) *Attorney, Agent, or Firm* — Withrow & Terranova, PLLC

(57) ABSTRACT

The present disclosure relates to digital up-conversion for a multi-band Multi-Order Power Amplifier (MOPA) that enables precise and accurate control of gain, phase, and delay of multi-band split signals input to the multi-band MOPA. In general, a multi-band MOPA is configured to amplify a multi-band signal that is split across a number, N, of inputs of the multi-band MOPA as a number, N, of multi-band split signals, where N is an order of the multi-band MOPA and is greater than or equal to 2. A digital upconversion system for the multi-band MOPA is configured to independently control a gain, phase, and delay for each of a number, M, of frequency bands of the multi-band signal for each of at least N−1, and preferably all, of the multi-band split signals.

25 Claims, 3 Drawing Sheets

Figure 1:
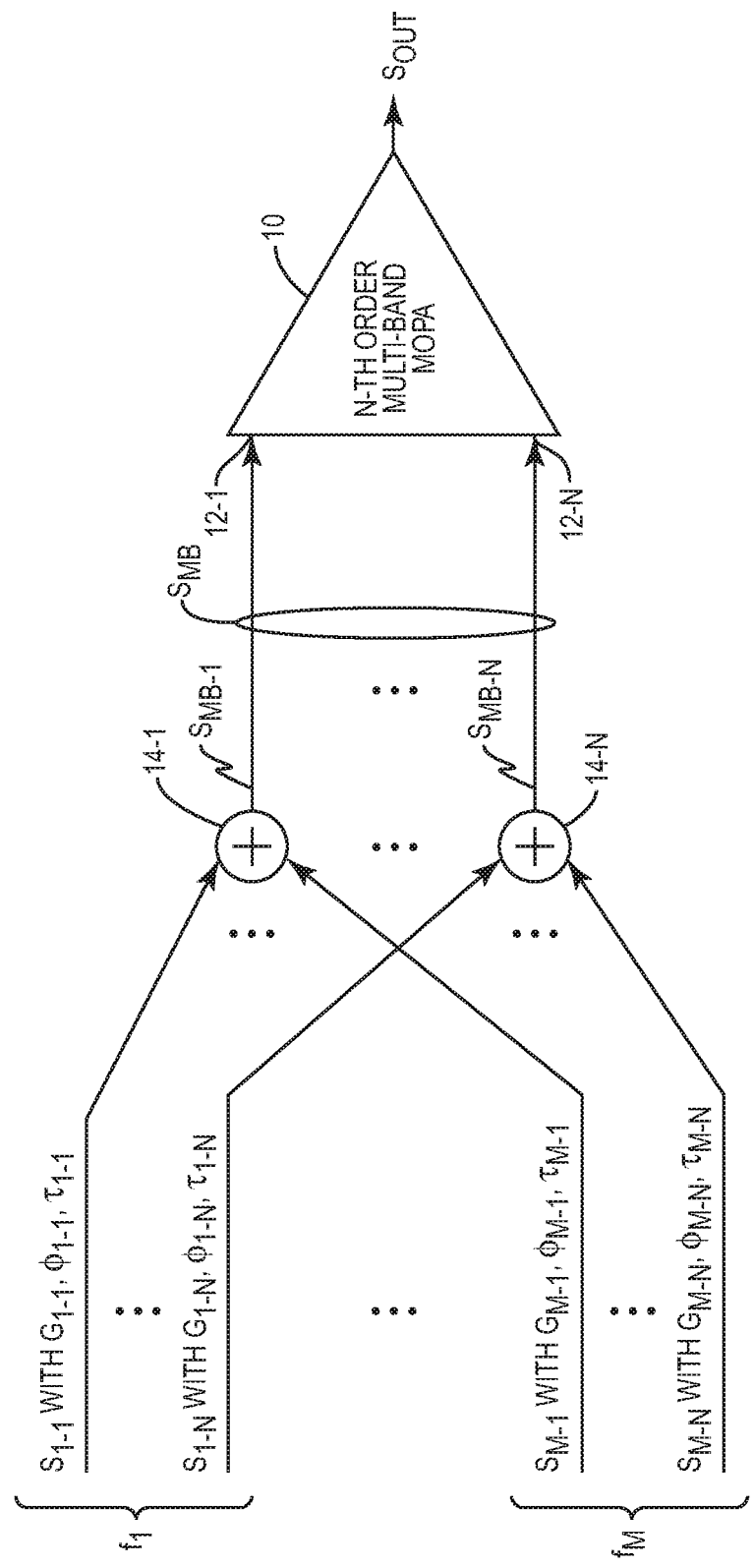

(51) Int. Cl.
| | |
|---|---|
| *H03F 1/32* | (2006.01) |
| *H03F 3/189* | (2006.01) |
| *H03F 3/21* | (2006.01) |
| *H03F 3/24* | (2006.01) |
| *H03F 3/68* | (2006.01) |
| *H03F 3/60* | (2006.01) |

(52) U.S. Cl.
CPC ........... *H03F 1/3282* (2013.01); *H03F 3/189* (2013.01); *H03F 3/211* (2013.01); *H03F 3/24* (2013.01); *H03F 3/604* (2013.01); *H03F 3/68* (2013.01); *H03L 7/00* (2013.01); *H03F 2200/111* (2013.01); *H03F 2200/451* (2013.01)

(58) Field of Classification Search
CPC ........... H03F 2203/21106; H03F 3/189; H03F 1/0227; H03F 3/604; H03F 2200/171
USPC .............................................. 370/503; 725/5
See application file for complete search history.

(56) References Cited

U.S. PATENT DOCUMENTS

| | | | |
|---|---|---|---|
| 4,604,583 | A | 8/1986 | Aoyagi et al. |
| 5,223,843 | A | 6/1993 | Hutchinson |
| 5,894,497 | A | 4/1999 | Overton |
| 7,376,206 | B1 | 5/2008 | Simic et al. |
| 7,505,531 | B1 | 3/2009 | Pasternak et al. |
| 8,055,235 | B1 * | 11/2011 | Gupta ...................... H04B 1/10 455/296 |
| 8,380,144 | B1 | 2/2013 | Bai et al. |
| 8,412,124 | B2 | 4/2013 | Morris et al. |
| 8,576,943 | B2 | 11/2013 | Kilambi et al. |
| 8,842,769 | B2 | 9/2014 | Morris |
| 9,432,946 | B2 | 8/2016 | Yamanouchi |
| 9,571,042 | B2 | 2/2017 | Morris et al. |
| 2002/0065048 | A1 | 5/2002 | Nagatani et al. |
| 2002/0089373 | A1 | 7/2002 | Takei et al. |
| 2003/0072284 | A1 | 4/2003 | Webster et al. |
| 2003/0162514 | A1 | 8/2003 | Chu et al. |
| 2003/0199259 | A1 | 10/2003 | Macedo et al. |
| 2004/0037311 | A1 | 2/2004 | Willes et al. |
| 2004/0263246 | A1 | 12/2004 | Robinson et al. |
| 2005/0163252 | A1 | 7/2005 | McCallister et al. |
| 2007/0201582 | A1 | 8/2007 | Okada et al. |
| 2008/0013639 | A1 | 1/2008 | Rick et al. |
| 2008/0238544 | A1 * | 10/2008 | Morris .................. H03F 1/0288 330/149 |
| 2009/0243719 | A1 | 10/2009 | Voisin et al. |
| 2009/0316838 | A1 | 12/2009 | Fuller et al. |
| 2010/0098131 | A1 | 4/2010 | Ahlers et al. |
| 2010/0098191 | A1 | 4/2010 | Morris et al. |
| 2010/0099363 | A1 * | 4/2010 | Faust ...................... H04B 17/10 455/69 |
| 2011/0151806 | A1 | 6/2011 | Kenington |
| 2012/0046004 | A1 | 2/2012 | Mirzaei et al. |
| 2012/0155572 | A1 | 6/2012 | Kim et al. |
| 2013/0064325 | A1 * | 3/2013 | Kilambi ................ H03F 1/3247 375/297 |

FOREIGN PATENT DOCUMENTS

| | | |
|---|---|---|
| JP | 2001-203540 A | 7/2001 |
| JP | 2005-020694 A | 1/2005 |
| WO | 2008009013 A2 | 1/2008 |
| WO | 2013136860 A1 | 9/2013 |

OTHER PUBLICATIONS

First Office Action for Japanese Patent Application No. 2015-523648, dated Jul. 4, 2017, 6 pages.
Author Unknown, "E-UTRA," Wikipedia, web page last modified Nov. 4, 2012, Wikimedia Foundation, Inc., 12 pages.
Lee, Ju Seop, "Microwave Resonator Filters for Advanced Wireless Systems," Dissertation for the Doctor of Philosophy (Electrical Engineering) in the University of Michigan, 2009, 169 pages.
Non-Final Office Action for U.S. Appl. No. 13/490,801, dated Jul. 16, 2013, 23 pages.
Final Office Action for U.S. Appl. No. 13/490,801, dated Dec. 3, 2013, 23 pages.
Notice of Allowance for U.S. Appl. No. 13/490,801, dated May 16, 2014, 11 pages.
Non-Final Office Action for U.S. Appl. No. 13/558,455, dated Jan. 9, 2015, 10 pages.
Final Office Action for U.S. Appl. No. 13/558,455, dated Jul. 16, 2015, 12 pages.
Advisory Action for U.S. Appl. No. 13/558,455, dated Oct. 6, 2015, 3 pages.
Non-Final Office Action for U.S. Appl. No. 13/558,455, dated Dec. 31, 2015, 13 pages.
Final Office Action for U.S. Appl. No. 13/558,455, dated Jul. 1, 2016, 14 pages.
Notice of Allowance and AFCP 2.0 Decision for U.S. Appl. No. 13/588,455, dated Oct. 5, 2016, 8 pages.
International Search Report and Written Opinion for PCT/IB2013/052526, dated Sep. 9, 2013, 10 pages.
International Preliminary Report on Patentability for PCT/IB2013/052526 dated Mar. 13, 2014, 7 pages.
First Office Action for Chinese Patent Application No. 201380050424.2, dated Sep. 26, 2016, 17 pages.
International Search Report and Written Opinion for PCT/IB2013/056037, dated Jan. 21, 2014, 13 pages.
International Preliminary Report on Patentability for PCT/IB2013/056037, dated Feb. 5, 2015, 10 pages.
Examination Report for European Patent Application No. 13774794.5, dated Feb. 27, 2019, 6 pages.
Notice of Preliminary Rejection for Korean Patent Application No. 2015-7004100, dated Jul. 19, 2019, 7 pages.

* cited by examiner

DIGITAL UPCONVERSION FOR MULTI-BAND MULTI-ORDER POWER AMPLIFIERS

RELATED APPLICATIONS

This application is a continuation of U.S. application Ser. No. 13/558,455, filed Jul. 26, 2012, now U.S. Pat. No. 9,571,042, the disclosure of which is incorporated herein by reference in its entirety.

FIELD OF THE DISCLOSURE

The present disclosure is related to digital upconversion for multi-band multi-order power amplifiers.

BACKGROUND

A Multi-Order Power Amplifier (MOPA) is a power amplifier having multiple inputs where an input signal to be amplified by the MOPA is split across the multiple inputs such that the resulting split input signals drive multiple amplification blocks. The split input signals are typically created by analog circuitry or an intelligent digital splitting algorithm. The multiple amplification blocks operate together to produce, at an output of the MOPA, an amplified version of the input signal. Some examples of a MOPA include a 2-way Doherty amplifier, a 3-way Doherty amplifier, a Linear Amplification with Nonlinear Components (LINC) amplifier, an Envelope Elimination and Restoration (EER) amplifier, and a Chireix amplifier.

MOPA operation requires that the split input signals be statically offset in phase, gain, and delay with respect to one another. There are several analog approaches to achieving this control. One approach is Radio Frequency (RF) analog splitting of the input signal as part of an input matching network of the MOPA (e.g., analog Doherty). Another approach is baseband signal splitting followed by analog upconversion, where individual compensation of each upconverter is required to match the gain, phase, and delay in the upconversion path and additional correction circuits and/or algorithms are required to correct for the amplitude and phase imbalance created by analog quadrature modulators.

Splitting the input signal in the analog domain is perhaps the simplest method, but the resulting split is frequency dependent and very limited in capability. Although phase, gain, and delay match across amplification paths can be achieved by physical symmetry of the splitting structure, compensating for any component variations becomes very difficult. This type of split limits the efficiency that can be achieved by a MOPA that has multiple simultaneous inputs and requires independent signal control over a range of frequencies.

Baseband signal splitting has advantages over RF analog splitting but requires that the upconversion chains be matched across the multiple instances for the multiple split input signals so that the split made at baseband remains intact after upconversion. Since upconversion is typically in the analog domain, this is a relatively difficult task for second order MOPAs but is extremely difficult for higher order MOPAs. Further, compensating gain, phase, and delay is frequency dependent and, even worse, is physical realization dependent (e.g., every unit built needs to be calibrated differently or an average calibration is used for all units which limits achievable performance).

One issue with existing approaches to offsetting the gain, phase, and delay of the split input signals provided to a MOPA is accuracy and complexity. As the order (i.e., the number of inputs) of the MOPA increases, the complexity of existing solutions becomes nearly insurmountable. Another issue with existing approaches is that they are frequency dependent. As such, they are not suitable for multi-band input signals.

SUMMARY

The present disclosure relates to digital up-conversion for a multi-band Multi-Order Power Amplifier (MOPA) that enables precise and accurate control of gain, phase, and delay of multi-band split signals input to the multi-band MOPA. In general, a multi-band MOPA is configured to amplify a multi-band signal that is split across a number, N, of inputs of the multi-band MOPA as a number, N, of multi-band split signals, where N is an order of the multi-band MOPA and is greater than or equal to 2. A digital upconversion system for the multi-band MOPA is configured to independently control a gain, phase, and delay for each of a number, M, of frequency bands of the multi-band signal for each of at least N−1, and preferably all, of the multi-band split signals. Preferably, the gain, phase, and delay for each of the frequency bands for each of the multi-band split signals are independently controlled such that one or more performance parameters of the multi-band MOPA (e.g., linearity, efficiency, and/or output power) are optimized.

In one embodiment, for each of the M frequency bands of the multi-band signal, the digital upconversion system includes a digital signal splitter that splits a digital baseband input signal for the frequency band into N baseband split signals for the frequency band. Each of the N baseband split signals for the frequency band corresponds to a different order of the N orders of the multi-band MOPA. Further, for each of the N baseband split signals for each of the M frequency bands, the digital upconversion system includes a digital upconverter that digitally upconverts the baseband split signal to a desired upconversion frequency to thereby provide a corresponding upconverted split signal. The digital upconverter includes one or more calibration actuators that are configured to control a gain, phase, and delay of the upconverted split signal. After digital upconversion, there is a different upconverted split signal for each of the orders of the multi-band MOPA for each of the frequency bands.

Further, in one embodiment, the digital upconversion system includes, for each of the N orders of the multi-band MOPA, a digital combiner and a digital-to-analog converter. The digital combiner is configured to digitally combine the upconverted split signals for the M frequency bands for the order of the multi-band MOPA to provide a combined upconverted digital signal for the order of the multi-band MOPA. The digital-to-analog converter then converts the combined upconverted digital signal into a combined upconverted analog signal for the order of the multi-band MOPA. The combined upconverted analog signal is then processed by analog circuitry to provide a corresponding multi-band split signal to a corresponding input of the multi-band MOPA. The one or more calibration actuators of the digital upconverters for the different orders of the multi-band MOPA for each of the frequency bands of the multi-band signal are independently configured to independently control a gain, phase, and delay of each of the upconverted split signals. In this manner, the digital upconversion system independently controls the gain, phase, and delay for each frequency band for each of the multi-band split signals input into the multi-band MOPA. In one embodiment, the gain, phase, and delay of each of the upconverted split signals is independently controlled to optimize one or more performance parameters of the multi-band MOPA (e.g., linearity, efficiency, and/or output power).

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
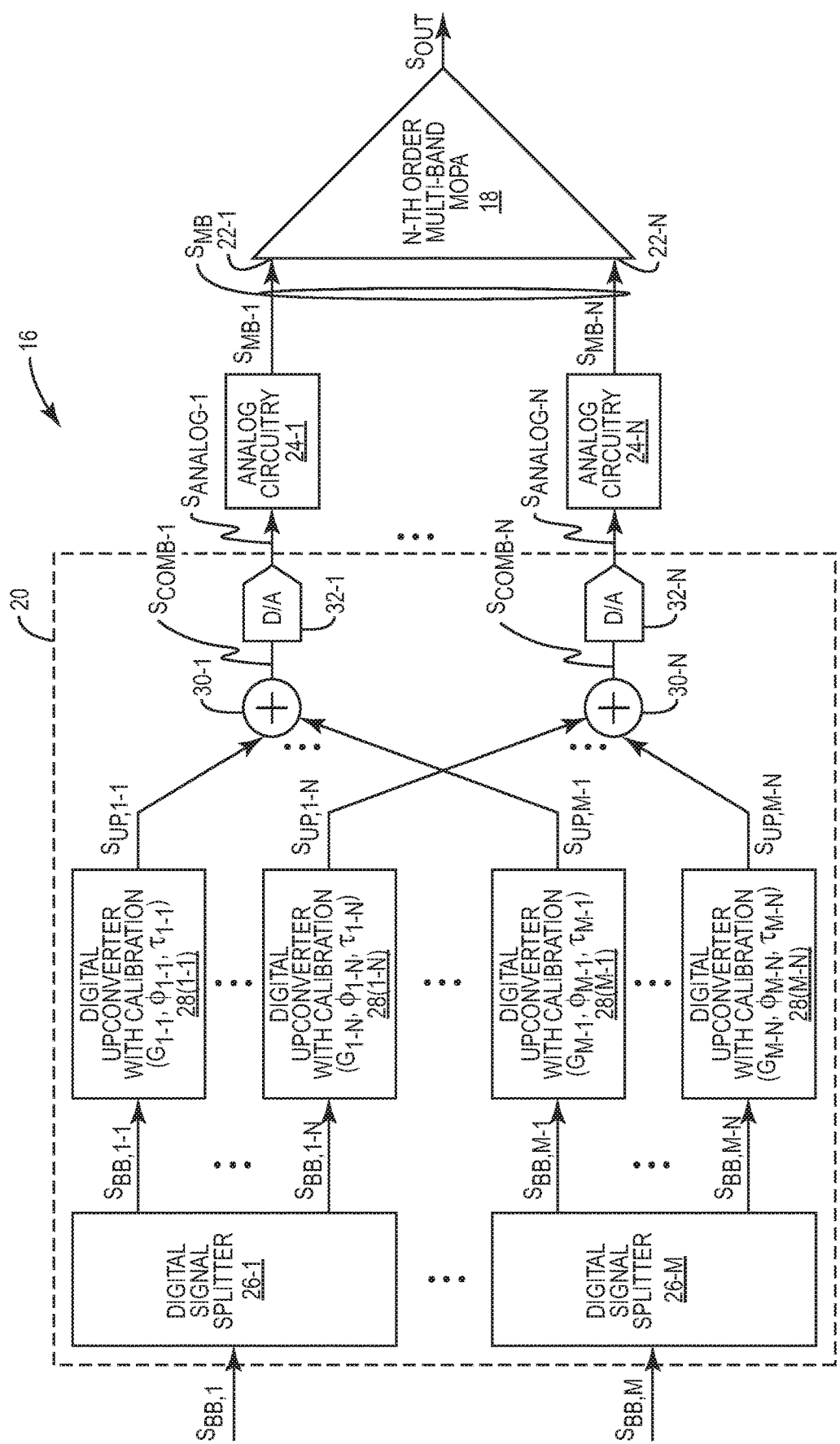
Figure 3:
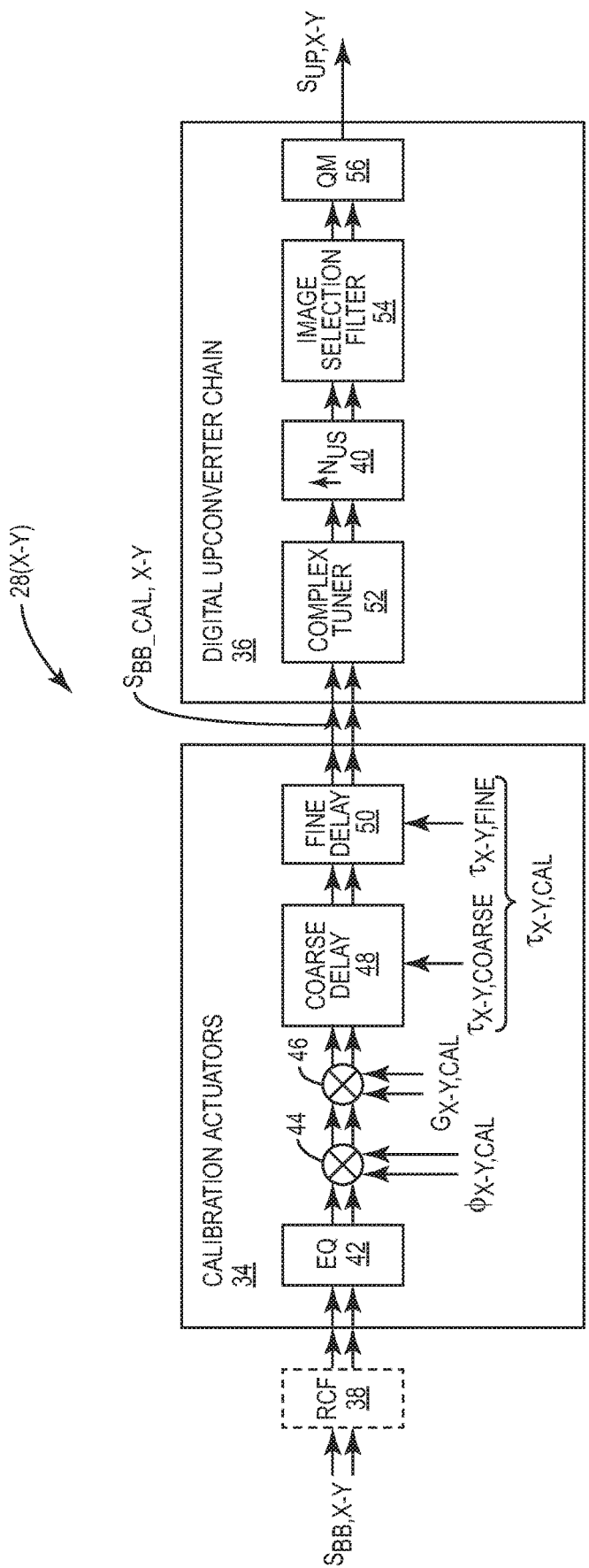

FIG. 1 illustrates a multi-band Multi-Order Power Amplifier (MOPA) that amplifies a multi-band signal that is split across multiple inputs of the multi-band MOPA as multiple multi-band split signals, wherein a gain, phase, and delay for each frequency band of the multi-band signal for each of the multi-band split signals is independently controlled in order to optimize one or more performance parameters of the multi-band MOPA according to one embodiment of the present disclosure;

FIG. 2 illustrates a system including a multi-band MOPA and a digital upconversion system that independently controls a gain, phase, and delay for each frequency band of the multi-band signal for each multi-band split signal input to the multi-band MOPA such that one or more performance parameters of the multi-band MOPA are optimized according to one embodiment of the present disclosure; and FIG. 3 illustrates one of the digital up-converters of FIG. 2 in more detail according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to digital up-conversion for a multi-band Multi-Order Power Amplifier (MOPA) that enables precise and accurate control of gain, phase, and delay of multi-band split signals input to the multi-band MOPA. In this regard, FIG. 1 illustrates a multi-band MOPA 10 having independent gain, phase, and delay calibration for each frequency band to be amplified by the multi-band MOPA 10 for each input of the multi-band MOPA 10 according to one embodiment of the present disclosure. In general, the multi-band MOPA 10 operates to amplify a multi-band signal ($S_{MB}$) that is split across a number (N) of inputs 12-1 through 12-N of the multi-band MOPA 10 as multi-band split signals ($S_{MB-1}$ through $S_{MB-N}$). The number N is the number of inputs 12-1 through 12-N of the multi-band MOPA 10 and is also referred to as an "order" of the multi-band MOPA 10. The number N is greater than or equal to 2. The multi-band signal ($S_{MB}$) has a number (M) of frequency bands, where M is greater than or equal to 2. The multi-band MOPA 10 may be, for example, a multi-band Doherty power amplifier (e.g., a 2-way or 3-way Doherty amplifier), a Linear Amplification with Nonlinear Components (LINC) amplifier, an Envelope Elimination and Restoration (EER) amplifier, and a Chireix amplifier.

As used herein, a "multi-band signal" is a signal that contains frequency components occupying multiple frequency bands (i.e., a first continuous frequency band, a second continuous frequency band, etc.) with no frequency components between adjacent frequency bands. Within each frequency band, the multi-band signal includes what is referred to herein as a "narrowband signal" at a corresponding carrier frequency of the multi-band signal. As used herein, a "narrowband signal" is not necessarily "narrowband" in the traditional sense, but has a bandwidth that is less than (i.e., narrower than) a total bandwidth of the multi-band signal. Notably, the narrowband signals in the frequency bands of the multi-band signal are preferably single band signals. However, in one alternative embodiment, one or more of the narrowband signals in one or more of the frequency bands of the multi-band signal may itself be a multi-band signal.

As illustrated, the multi-band split signals ($S_{MB-1}$ through $S_{MB-N}$) provided to the inputs 12-1 through 12-N of the multi-band MOPA 10 are generated from a number (N) of split signals for each of the M frequency bands of the multi-band signal ($S_{MB}$), which are referred to as split signals $S_{1-1}$ through $S_{1-N}$, ..., $S_{M-1}$ through $S_{M-N}$, respectively. More specifically, as illustrated, the split signals $S_{1-1}$ through $S_{1-N}$ are for a first carrier frequency ($f_1$) for the multi-band signal ($S_{MB}$) (i.e., for a first frequency band of the multi-band signal ($S_{MB}$)). Likewise, the split signals $S_{M-1}$ through $S_{M-N}$ are for an M-th carrier frequency ($f_M$) for the multi-band signal ($S_{MB}$) (i.e., for an M-th frequency band of the multi-band signal ($S_{MB}$)). A combiner 14-1 combines the split signals $S_{1-1}$ through $S_{M-1}$ (i.e., the split signals for the first order, or input, of the multi-band MOPA 10 for all M frequency bands) to provide the multi-band split signal ($S_{MB-1}$) for the input 12-1 of the multi-band MOPA 10. Likewise, a combiner 14-N combines the split signals $S_{1-N}$ through $S_{M-N}$ (i.e., the split signals for the N-th order, or input, of the multi-band MOPA 10 for all M frequency bands) to provide the multi-band split signal ($S_{MB-N}$) for the input 12-N of the multi-band MOPA 10. While not illustrated, the combiners 14-1 through 14-N are preferably digital combiners, and digital-to-analog converters and analog circuitry subsequent to the digital combiners further process the output of the digital combiners to provide the multi-band split signals ($S_{MB-1}$ through $S_{MB-N}$). However, in FIG. 1, these elements are omitted for clarity and ease of discussion.

The multi-band split signals ($S_{MB-1}$ through $S_{MB-N}$) are amplified by the multi-band MOPA 10 to provide a multi-band output signal ($S_{OUT}$). As discussed below in detail, a gain, phase, and delay of each of the split signals ($S_{1-1}$ through $S_{1-N}$, ..., $S_{M-1}$ through $S_{M-N}$) are independently controlled, or configured. As such, the gain ($G_{1-1}$), phase ($\phi_{1-1}$), and delay ($\tau_{1-1}$) of the split signal ($S_{1-1}$) are controlled independently from the gains, phases, and delays of all of the other split signals for all M of the frequency bands, the gain ($G_{1-2}$), phase ($\phi_{1-2}$), and delay ($\tau_{1-2}$) of the split signal ($S_{1-2}$) are controlled independently from the gain, phase, and delay of all of the other split signals for all M of the frequency bands, etc. In this manner, a gain, phase, and delay for each of the M frequency bands for each of the multi-band split signals ($S_{MB\text{-}1}$ through $S_{MB\text{-}N}$) are independently controlled. Preferably, the gain, phase, and delay of each of the split signals ($S_{1\text{-}1}$ through $S_{1\text{-}N}, \ldots, S_{M\text{-}1}$ through $S_{M\text{-}N}$), and thus the gain, phase, and delay for each of the M frequency bands for each of the multi-band split signals ($S_{MB\text{-}1}$ through $S_{MB\text{-}N}$), are independently controlled such that one or more performance parameters (e.g., efficiency, linearity, and/or output power) of the multi-band MOPA 10 are optimized. In one embodiment, the one or more performance parameters include efficiency and one or both of linearity and output power. In one particular embodiment, the gain, phase, and delay of each of the split signals ($S_{1\text{-}1}$ through $S_{1\text{-}N}, \ldots, S_{M\text{-}1}$ through $S_{M\text{-}N}$) are independently controlled to maximize efficiency while maintaining sufficient linearity to satisfy one or more predefined requirements for the multi-band MOPA 10 (e.g., predefined emissions requirements).

Before proceeding, it should be noted that values for the gain, phase, and delay of each of the split signals ($S_{1\text{-}1}$ through $S_{1\text{-}N}, \ldots, S_{M\text{-}1}$ through $S_{M\text{-}N}$) may be selected, or calibrated, using any suitable technique. In one particular embodiment, values for the gain, phase, and delay of each of the split signals ($S_{1\text{-}1}$ through $S_{1\text{-}N}, \ldots, S_{M\text{-}1}$ through $S_{M\text{-}N}$) are selected in a factory calibration process. For instance, one or more performance parameters of the multi-band MOPA 10 may be measured while adjusting the values for the gain, phase, and delay of each of the split signals ($S_{1\text{-}1}$ through $S_{1\text{-}N}, \ldots, S_{M\text{-}1}$ through $S_{M\text{-}N}$) using any suitable algorithm until the values that provide the desired optimization of the one or more performance parameters are determined. These values may then be stored and utilized during operation of the multi-band MOPA 10. In another embodiment, the values for the gain, phase, and delay of each of the split signals ($S_{1\text{-}1}$ through $S_{1\text{-}N}, \ldots, S_{M\text{-}1}$ through $S_{M\text{-}N}$) may be selected dynamically based on measurements of the multi-band output signal ($S_{OUT}$) during operation of the multi-band MOPA 10. In this manner, the values for the gain, phase, and delay of each of the split signals ($S_{1\text{-}1}$ through $S_{1\text{-}N}, \ldots, S_{M\text{-}1}$ through $S_{M\text{-}N}$) can be updated over time as needed to optimize the one or more performance parameters of the multi-band MOPA 10.

FIG. 2 illustrates a system 16 that includes a multi-band MOPA 18 and a digital upconversion system 20 for the multi-band MOPA 18 according to one embodiment of the present disclosure. In general, the multi-band MOPA 18 operates to amplify a multi-band signal ($S_{MB}$) that is split across a number (N) of inputs 22-1 through 22-N of the multi-band MOPA 18 as multi-band split signals ($S_{MB\text{-}1}$ through $S_{MB\text{-}N}$). The number N is the number of inputs 22-1 through 22-N of the multi-band MOPA 18 and is also referred to as an "order" of the multi-band MOPA 18. The number N is greater than or equal to 2. The multi-band signal ($S_{MB}$) has a number (M) of frequency bands, where M is greater than or equal to 2. The multi-band MOPA 18 may be, for example, a multi-band Doherty power amplifier, (e.g., a 2-way or 3-way Doherty amplifier), a LINC amplifier, an EER amplifier, and a Chireix amplifier.

The digital upconversion system 20 digitally upconverts digital baseband signals ($S_{BB,1}$ through $S_{BB,M}$) for the M frequency bands of the multi-band signal ($S_{MB}$) and generates N multi-band analog signals ($S_{ANALOG\text{-}1}$ through $S_{ANALOG\text{-}N}$) that, after further processing by analog circuitries 24-1 through 24-N, provide the multi-band split signals ($S_{MB\text{-}1}$ through $S_{MB\text{-}N}$) to the respective inputs 22-1 through 22-N of the multi-band MOPA 18. More specifically, the digital upconversion system 20 includes digital signal splitters 26-1 through 26-M, digital upconverters 28(1-1) through 28(M-N) each including one or more calibration actuators, digital combiners 30-1 through 30-N, and digital-to-analog (D/A) converters 32-1 through 32-N connected as shown. The digital signal splitter 26-1 operates to split the digital baseband signal ($S_{BB,1}$) into N baseband split signals ($S_{BB,1\text{-}1}$ through $S_{BB,1\text{-}N}$) each corresponding to a different order, or input, of the multi-band MOPA 18. The manner in which the digital signal splitter 26-1 splits the digital baseband signal ($S_{BB,1}$) can vary depending on the particular implementation. Further, any suitable digital splitting technique may be used. As one example, the digital signal splitter 26-1 equally splits the digital baseband signal ($S_{BB,1}$) into the baseband split signals ($S_{BB,1\text{-}1}$ through $S_{BB,1\text{-}N}$). As another example, if the multi-band MOPA 18 is a $2^{nd}$ order Doherty amplifier, the digital signal splitter 26-1 may provide the entire digital baseband signal ($S_{BB,1}$) to the baseband split signal ($S_{BB,1\text{-}1}$) when a voltage of the digitally represented signal is less than a predefined threshold and equally split the digital baseband signal ($S_{BB,1}$) across the baseband split signals ($S_{BB,1\text{-}1}$ and $S_{BB,1\text{-}2}$) when the voltage of the digitally represented signal is greater than or equal to the predefined threshold. As yet another example, if the multi-band MOPA 18 is a $2^{nd}$ order Doherty amplifier, the digital signal splitter 26-1 may provide peaks of the digital baseband signal ($S_{BB,1}$) to the baseband split signal ($S_{BB,1\text{-}2}$) and the remaining non-peak portion of the digital baseband signal ($S_{BB,1}$) to the baseband split signal ($S_{BB,1\text{-}1}$). The examples above are only examples and are not intended to limit the scope of the present disclosure.

The digital upconverters 28(1-1) through 28(1-N) digitally upconvert the baseband split signals ($S_{BB,1\text{-}1}$ through $S_{BB,1\text{-}N}$), respectively, to a desired upconversion frequency for the first frequency band, thereby providing upconverted split signals ($S_{UP,1\text{-}1}$ through $S_{UP,1\text{-}N}$). In one embodiment, the desired upconversion frequency is a carrier frequency for the first frequency band of the multi-band signal ($S_{MB}$). However, the desired upconversion frequency is not limited thereto. The digital upconverters 28(1-1) through 28(1-N) each include one or more calibration actuators that control a gain, phase, and delay of the corresponding upconverted split signal. Thus, the digital upconverter 28(1-1) includes one or more calibration actuators that control a gain ($G_{1\text{-}1}$), phase ($\phi_{1\text{-}1}$), and delay ($\tau_{1\text{-}1}$) of the upconverted split signal ($S_{UP,1\text{-}1}$). Likewise, the digital upconverter 28(1-N) includes one or more calibration actuators that control a gain ($G_{1\text{-}N}$), phase ($\phi_{1\text{-}N}$), and delay ($\tau_{1\text{-}N}$) of the upconverted split signal ($S_{UP,1\text{-}N}$).

In the same manner, the digital signal splitter 26-M operates to split the digital baseband signal ($S_{BB,M}$) into N baseband split signals ($S_{BB,M\text{-}1}$ through $S_{BB,M\text{-}N}$) each corresponding to a different order, or input, of the multi-band MOPA 18. As discussed above with respect to the digital signal splitter 26-1, the manner in which the digital signal splitter 26-M splits the digital baseband signal ($S_{BB,M}$) can vary depending on the particular implementation. Further, any suitable splitting technique may be used. The digital upconverters 28(M-1) through 28(M-N) digitally upconvert the baseband split signals ($S_{BB,M\text{-}1}$ through $S_{BB,M\text{-}N}$), respectively, to a desired upconversion frequency for the M-th frequency band, thereby providing upconverted split signals ($S_{UP,M\text{-}1}$ through $S_{UP,M\text{-}N}$). The digital upconverters 28(M-1) through 28(M-N) each include one or more calibration actuators that control a gain, phase, and delay of the corresponding upconverted split signal. Thus, the digital upconverter 28(M-1) includes one or more calibration actuators that control a gain ($G_{M\text{-}1}$), phase ($\phi_{M\text{-}1}$), and delay ($\tau_{M\text{-}1}$) of the upconverted split signal ($S_{UP,M\text{-}1}$). Likewise, the digital upconverter 28(M-N) includes one or more calibration actuators that control a gain ($G_{M\text{-}N}$), phase ($\phi_{M\text{-}N}$), and delay ($\tau_{M\text{-}N}$) of the upconverted split signal ($S_{UP,M\text{-}N}$).

Next, the digital combiners 30-1 through 30-N combine the upconverted split signals for the corresponding orders, or inputs, of the multi-band MOPA 18 to provide corresponding combined digital signals ($S_{COMB\text{-}1}$ through $S_{COMB\text{-}N}$). Each of the combined digital signals ($S_{COMB\text{-}1}$ through $S_{COMB\text{-}N}$) is a multi-band digital signal that includes the upconverted split signals for the respective order of the multi-band MOPA 18. More specifically, the digital combiner 30-1 combines the upconverted split signals ($S_{UP,1\text{-}1}$ through $S_{UP,M\text{-}1}$) for the first order, or first input 22-1, of the multi-band MOPA 18 to provide the combined digital signal ($S_{COMB\text{-}1}$) for the first order of the multi-band MOPA 18. Likewise, the digital combiner 30-N combines the upconverted split signals ($S_{UP,1\text{-}N}$ through $S_{UP,M\text{-}N}$) for the N-th order, or N-th input 22-N, of the multi-band MOPA 18 to provide the combined digital signal ($S_{COMB\text{-}N}$) for the N-th order of the multi-band MOPA 18. The D/A converters 32-1 through 32-N then digital-to-analog convert the combined digital signals ($S_{COMB\text{-}1}$ through $S_{COMB\text{-}N}$), respectively, to provide the multi-band analog signals ($S_{ANALOG\text{-}1}$ through $S_{ANALOG\text{-}N}$), which are also referred to herein as combined analog signals.

Lastly, the multi-band analog signals ($S_{ANALOG\text{-}1}$ through $S_{ANALOG\text{-}N}$) are processed by the analog circuitries 24-1 through 24-N, respectively, to provide the multi-band split signals ($S_{MB\text{-}1}$ through $S_{MB\text{-}N}$) to the respective inputs 22-1 through 22-N of the multi-band MOPA 18. The analog circuitries 24-1 through 24-N may include any desired analog circuitry such as, for example, one or more analog filters that operate to remove undesired frequency components from the multi-band analog signals ($S_{ANALOG\text{-}1}$ through $S_{ANALOG\text{-}N}$) and, potentially, one or more preamplifiers.

Importantly, the calibration actuators in the digital upconverters 28(1-1) through 28(M-N) independently control the gains ($G_{1\text{-}1}$ through $G_{M\text{-}N}$), phases ($\phi_{1\text{-}1}$ through $\phi_{M\text{-}N}$), and delays ($\tau_{1\text{-}1}$ through $\tau_{M\text{-}N}$) of the upconverted split signals ($S_{UP,1\text{-}1}$ through $S_{UP,M\text{-}N}$). In doing so, the calibration actuators in the digital upconverters 28(1-1) through 28(M-N) independently control the gains, phases, and delays for each of the M frequency bands for each of the multi-band split signals ($S_{MB\text{-}1}$ through $S_{MB\text{-}N}$). Notably, independent control of the gains ($G_{1\text{-}1}$ through $G_{M\text{-}N}$), phases ($\phi_{1\text{-}1}$ through $\phi_{M\text{-}N}$), and delays ($\tau_{1\text{-}1}$ through $\tau_{M\text{-}N}$) of the upconverted split signals ($S_{UP,1\text{-}1}$ through $S_{UP,M\text{-}N}$) is beneficial in that, while the effects on gain, phase, and delay of the digital circuitry in the digital upconversion system 20 are deterministic, the effects on gain, phase, and delay of the analog circuitries 24-1 through 24-N are non-deterministic (e.g., variations over temperature, variations in manufacturing, aging, etc.).

Preferably, using the calibration actuators in the digital upconverters 28(1-1) through 28(M-N), the gains ($G_{1\text{-}1}$ through $G_{M\text{-}N}$), phases ($\phi_{1\text{-}1}$ through $\phi_{M\text{-}N}$), and delays ($\tau_{1\text{-}1}$ through $\tau_{M\text{-}N}$) of the upconverted split signals ($S_{UP,1\text{-}1}$ through $S_{UP,M\text{-}N}$), and thus the gains, phases, and delays for each of the M frequency bands for each of the multi-band split signals ($S_{MB\text{-}1}$ through $S_{MB\text{-}N}$), are independently controlled, or configured, to optimize one or more performance parameters (e.g., efficiency, linearity, and/or output power) of the multi-band MOPA 18. Note that, in another embodiment, the gains, phases, and delays for each of the M frequency bands for each of only N−1 of the upconverted split signals ($S_{UP,1\text{-}1}$ through $S_{UP,M\text{-}N}$) may be calibrated since it may be preferable to control the offsets between the gains, phases, and delays, rather than their absolute values.

In one embodiment, the one or more performance parameters include efficiency and one or both of linearity and output power. In one particular embodiment, using the calibration actuators in the digital upconverters 28(1-1) through 28(M-N), the gains ($G_{1\text{-}1}$ through $G_{M\text{-}N}$), phases ($\phi_{1\text{-}1}$ through $\phi_{M\text{-}N}$), and delays ($\tau_{1\text{-}1}$ through $\tau_{M\text{-}N}$) of the upconverted split signals ($S_{UP,1\text{-}1}$ through $S_{UP,M\text{-}N}$), and thus the gains, phases, and delays for each of the M frequency bands for each of the multi-band split signals ($S_{MB\text{-}1}$ through $S_{MB\text{-}N}$), are independently controlled, or configured, to maximize an efficiency of the multi-band MOPA 18 while maintaining sufficient linearity to satisfy one or more predefined requirements for the multi-band MOPA 18 (e.g., predefined emissions requirements).

The values for the gains ($G_{1\text{-}1}$ through $G_{M\text{-}N}$), phases ($\phi_{1\text{-}1}$ through $\phi_{M\text{-}N}$), and delays ($\tau_{1\text{-}1}$ through $\tau_{M\text{-}N}$) of the upconverted split signals ($S_{UP,1\text{-}1}$ through $S_{UP,M\text{-}N}$) may be selected, or calibrated, using any suitable technique. In one particular embodiment, values for the gains ($G_{1\text{-}1}$ through $G_{M\text{-}N}$), phases ($\phi_{1\text{-}1}$ through $\phi_{M\text{-}N}$), and delays ($\tau_{1\text{-}1}$ through $\tau_{M\text{-}N}$) of the upconverted split signals ($S_{UP,1\text{-}1}$ through $S_{UP,M\text{-}N}$) are selected in a factory calibration process. For instance, one or more performance parameters of the multi-band MOPA 18 may be measured while adjusting the values for the gains ($G_{1\text{-}1}$ through $G_{M\text{-}N}$), phases ($\phi_{1\text{-}1}$ through $\phi_{M\text{-}N}$), and delays ($\tau_{1\text{-}1}$ through $\tau_{M\text{-}N}$) of the upconverted split signals ($S_{UP,1\text{-}1}$ through $S_{UP,M\text{-}N}$) using any suitable algorithm until the values that provide the desired optimization of the one or more performance parameters are determined. These values may then be stored by the digital upconversion system 20 or otherwise programmed into the digital upconversion system 20 and utilized during operation of the multi-band MOPA 18. In another embodiment, the values for the gains ($G_{1\text{-}1}$ through $G_{M\text{-}N}$), phases ($\phi_{1\text{-}1}$ through $\phi_{M\text{-}N}$), and delays ($\tau_{1\text{-}1}$ through $\tau_{M\text{-}N}$) of the upconverted split signals ($S_{UP,1\text{-}1}$ through $S_{U,M\text{-}N}$) may be selected dynamically based on measurements of the multi-band output signal ($S_{OUT}$) during operation of the multi-band MOPA 18. In this manner, the values for the gains ($G_{1\text{-}1}$ through $G_{M\text{-}N}$), phases ($\phi_{1\text{-}1}$ through $\phi_{M\text{-}N}$), and delays ($\tau_{1\text{-}1}$ through $\tau_{M\text{-}N}$) of the upconverted split signals ($S_{UP,1\text{-}1}$ through $S_{UP,M\text{-}N}$) can be updated over time as needed to optimize the one or more performance parameters of the multi-band MOPA 18.

FIG. 3 is a more detailed illustration of one of the digital upconverters 28(1-1) through 28(M-N) of FIG. 2, which is generally designated as 28(X-Y), according to one embodiment of the present disclosure. As illustrated, the digital upconverter 28(X-Y) includes a number of calibration actuators 34, a digital upconverter chain 36, and, in some embodiments, a Rate Change Filter (RCF) 38. The RCF 38 may be desired if a sampling rate of the baseband split signal ($S_{BB,X\text{-}Y}$) is not equal to $f_S/N_{US}$, where $f_S$ is an effective sampling rate of the D/A converter 32-Y and $N_{US}$ is an up-sampling rate of an upsampler 40 of the digital upconverter chain 36. In effect, the RCF 38 is a bridge between the sampling rate of the baseband split signal ($S_{BB,X\text{-}Y}$) and the effective sampling rate of the D/A converter 32-Y.

As illustrated, in this embodiment, the baseband split signal ($S_{BB,X\text{-}Y}$) is a complex signal. In some embodiments, the sampling rate of the baseband split signal ($S_{BB,X\text{-}Y}$) is changed by the RCF 38. Then, the baseband split signal ($S_{BB,X\text{-}Y}$) is provided to the calibration actuators 34. In general, the calibration actuators 34 control the gain ($G_{X\text{-}Y}$), phase ($\phi_{X\text{-}Y}$), and delay ($\tau_{X\text{-}Y}$) of the upconverted split signal ($S_{UP,X\text{-}Y}$) via corresponding calibration values ($G_{X\text{-}Y,CAL}$, $\phi_{X\text{-}Y,CAL}$, and $\tau_{X\text{-}Y,CAL}$). More specifically, the calibration actuators 34 include an equalizer 42, complex multipliers 44 and 46, a coarse delay circuit 48, and a fine delay circuit 50. Note that the ordering of the equalizer 42, the complex multipliers 44 and 46, the coarse delay 48, and the fine delay 50 may be changed. The equalizer 42 operates to effectively equalize the response of the corresponding analog circuitry 24-Y. The complex multipliers 44 and 46 multiply the equalized baseband split signal by the phase and gain calibration values ($\phi_{X-Y,CAL}$ and $G_{X-Y,CAL}$), respectively. The phase and gain calibration values ($\phi_{X-Y,CAL}$ and $G_{X-Y,CAL}$) are such that the upconverted split signal ($S_{UP,X-Y}$) has the desired phase ($\phi_{X-Y}$) and gain ($G_{X-Y}$). Notably, in one alternative embodiment, the complex multipliers 44 and 46 are combined into a single complex multiplier that calibrates both gain and phase. Before proceeding, it should be noted that while, in this embodiment, the calibration actuators 34 are implemented at baseband, the present disclosure is not limited thereto. One or more, and possibly all, of the calibration actuators 34 may implemented during or after digital upconversion.

The phase and gain calibrated baseband split signal is then passed through the coarse and fine delay circuits 48 and 50 to provide a calibrated baseband split signal ($S_{BB\_CAL,X-Y}$). A coarse delay applied by the coarse delay circuit 48 is controlled by a coarse delay calibration value ($\tau_{X-Y,COARSE}$). As one example, the coarse delay circuit 48 may be implemented as a series of flip-flops, and the coarse delay calibration value ($\tau_{X-Y,COARSE}$) selects the output of one of the flip-flops as the output of the coarse delay circuit 48, which thereby controls the delay provided by the coarse delay circuit 48. A fine delay applied by the fine delay circuit 50 is controlled by a fine delay calibration value ($\tau_{X-Y,FINE}$). As one example, the fine delay circuit 50 may be implemented as a filter, where the fine delay calibration value ($\tau_{X-Y,FINE}$) is one or more filter coefficients. Together, the coarse and fine calibration values ($\tau_{X-Y,COARSE}$ and $\tau_{X-Y,FINE}$) form a delay calibration value ($\tau_{X-Y,CAL}$).

The calibrated baseband split signal ($S_{BB\_CAL,X-Y}$) is then digitally upconverted by the digital upconverter chain 36 to provide the upconverted split signal ($S_{UP,X-Y}$) at the desired upconversion frequency. In one embodiment, the desired upconversion frequency is the carrier frequency for the corresponding frequency band of the multi-band signal ($S_{MB}$). However, in other embodiments, the desired upconversion frequency is a predetermined frequency that is selected such that, after processing of the upconverted split signal ($S_{UP,X-Y}$) by the D/A converter 32-Y and the analog circuitry 24-Y, the resulting signal is at the desired carrier frequency for the corresponding frequency band of the multi-band signal ($S_{MB}$).

In this example, the digital upconverter chain 36 includes a complex tuner 56 that tunes the calibrated baseband split signal ($S_{BB\_CAL,X-Y}$), which is a complex signal, to a desired frequency. The complex tuner 56 tunes the calibrated baseband split signal ($S_{BB\_CAL,X-Y}$) to a desired baseband tuning frequency to thereby produce a complex tuned digital split signal. In one embodiment, the baseband tuning frequency is programmable or otherwise selectable within a range of $-f_S/2N_{US}$ and $f_S/2N_{US}$, where $f_S$ is the effective sampling rate of the D/A converter 32-Y and $N_{US}$ is the up-sampling rate of the upsampler 40.

The upsampler 40 up-samples the complex tuned digital split signal at the up-sampling rate $N_{US}$, where $N_{US} \geq 2$, to produce an upsampled digital split signal having a sampling rate of $f_S$. In the frequency domain, the upsampled digital split signal includes $N_{US}$ images of the complex tuned digital split signal equally spaced apart in the frequency range of 0 to $f_S$, where $f_S$ is the effective sampling rate of the D/A converter 32-Y. An image selection filter 54 filters the upsampled digital split signal to select a desired one of the images of the complex tuned digital split signal and thereby provide a filtered split signal. More specifically, the image selection filter 54 is preferably programmable via one or more parameters (e.g., filter coefficients) such that a passband of the image selection filter 54 is centered at a desired filter tuning frequency. The filter tuning frequency is selected such that the desired image of the complex tuned digital split signal falls within the passband of the image selection filter 54.

A digital quadrature modulator 56 performs quadrature modulation on the filtered split signal to provide the upconverted split signal ($S_{UP,X-Y}$) output by the digital upconverter chain 36. In the frequency domain, quadrature modulation results in frequency translating, or frequency-shifting, the image of the complex tuned digital split signal in the filtered split signal by $f_{QMOD}$, where $f_{QMOD}$ is a modulation frequency of the digital quadrature modulator 56, and converting the complex signal into a real signal. The modulation frequency ($f_{QMOD}$) can be any desired frequency including zero. After digital quadrature modulation, the frequency-translated image of the complex tuned digital split signal is centered at the desired upconversion frequency for the digital upconverter chain 36.

Notably, the digital quadrature modulator 56 may be configurable to operate on a definition of quadrature modulation as a+jb or a−jb. This may be desirable because, for example, different cellular communication standards (e.g., Code Division Multiple Access (CDMA) 2000 and 3$^{rd}$ Generation Partnership Project (3GPP)) may define quadrature modulation differently. Therefore, in order to accommodate different communication standards, the digital quadrature modulator 56 may be configurable in this manner. Alternatively, this configuration may be handled by a complex conjugate function prior to the complex tuner 52 that can be activated or deactivated as needed. Further, in one embodiment, the digital quadrature modulator 56 may be combined with the image selection filter 54.

For more information regarding the digital upconverter chain 36 and some example implementations of the complex tuner 52, the upsampler 40, the image selection filter 54, and the digital quadrature modulator 56, the interested reader is directed to commonly owned and assigned U.S. Patent Application Publication No. 2010/0098191 A1, entitled METHODS AND SYSTEMS FOR PROGRAMMABLE DIGITAL UP-CONVERSION, filed on Oct. 20, 2008 and published on Apr. 22, 2010, which is incorporated herein by reference in its entirety. For example, while the upsampler 40 and the image selection filter 54 may be implemented as separate components, they are not limited thereto. The upsampler 40 and the image selection filter 54 may alternatively be implemented together as a polyphase filter that performs both up-sampling and image selection filtering. As another example, the digital upconverter chain 36 may include multiple upsamplers 40 and image selection filters 54 arranged in a number of upsampling and filtering stages. Also, while not essential to the understanding of the present disclosure, for further information regarding digital upconversion, the interested reader is directed to commonly owned and assigned U.S. patent application Ser. No. 13/490,801, entitled PROGRAMMABLE DIGITAL UP-CONVERSION FOR CONCURRENT MULTI-BAND SIGNALS, filed on Jun. 7, 2012, which is incorporated herein by reference in its entirety.

The digital upconversion system 20 including the independent control of gain, phase, and delay of the upconverted split signals ($S_{UP,1-1}$ through $S_{UP,M-N}$) enables precise control of the gain, phase, and delay for each of the M frequency bands for each of the multi-band split signals ($S_{MB-1}$ through $S_{MB-N}$). One benefit of this precise control is that the gain, phase, and delay for each of the M frequency bands for each of the multi-band split signals ($S_{MB-1}$ through $S_{MB-N}$) can be configured such that the multi-band MOPA 18 operates at a desired operating point. This desired operating point may be selected to optimize one or more performance parameters (e.g., efficiency, linearity, and/or output power).

The following acronyms are used throughout this disclosure.
3GPP $3^{rd}$ Generation Partnership Project
CDMA Code Division Multiple Access
D/A Digital-to-Analog
DAC Digital-to-Analog Converter
EER Envelope Elimination and Restoration
LINC Linear Amplification with Nonlinear Components
MOPA Multi-Order Power Amplifier
RF Radio Frequency Those skilled in the art will recognize improvements and modifications to the preferred embodiments of the present disclosure. All such improvements and modifications are considered within the scope of the concepts disclosed herein and the claims that follow.

What is claimed is:

1. A system comprising:
a multi-band multi-order power amplifier configured to amplify a multi-band signal split across a plurality of inputs of the multi-band multi-order power amplifier as a plurality of multi-band split signals, the plurality of inputs comprising a different input for each of N orders of the multi-band multi-order power amplifier where N is greater than or equal to 2; and
a digital upconversion system for the multi-band multi-order power amplifier that is configured to control a gain, phase, and delay for each of M frequency bands of the multi-band signal for each of at least N−1 of the plurality of multi-band split signals independently from the gains, phases, and delays of other multi-band split signals such that an efficiency of the multi-band multi-order power amplifier is maximized while maintaining sufficient linearity to satisfy one or more predefined requirements for the multi-band multi-order power amplifier.

2. The system of claim 1 wherein the multi-band signal comprises M narrowband signals in the M frequency bands of the multi-band signal wherein M is greater than or equal to 2, and the digital upconversion system comprises, for each frequency band of the M frequency bands of the multi-band signal:
a digital signal splitter that splits a digital baseband signal for the frequency band into N baseband split signals for the frequency band, each of the N baseband split signals for the frequency band being for a different order of the N orders of the multi-band multi-order power amplifier; and
for each baseband split signal for the frequency band of the N baseband split signals for the frequency band, a digital upconverter that upconverts the baseband split signal for the frequency band to a desired upconversion frequency to thereby provide an upconverted split signal for the frequency band, the digital upconverter comprising one or more calibration actuators configured to control a gain, phase, and delay of the upconverted split signal for the frequency band.

3. The system of claim 2 wherein the digital upconversion system further comprises, for each order of the N orders of the multi-band multi-order power amplifier:
a digital combiner configured to digitally combine the upconverted split signals for the M frequency bands of the multi-band signal for the order of the multi-band multi-order power amplifier to provide a combined upconverted digital signal for the order of the multi-band multi-order power amplifier; and
a digital-to-analog converter configured to digital-to-analog convert the combined upconverted digital signal for the order of the multi-band multi-order power amplifier to provide a combined upconverted analog signal for the order of the multi-band multi-order power amplifier.

4. The system of claim 3 further comprising, for each order of the N orders of the multi-band multi-order power amplifier:
analog circuitry configured to process the combined upconverted analog signal for the order of the multi-band multi-order power amplifier to provide one of the plurality of multi-band split signals for one of the plurality of inputs of the multi-band multi-order power amplifier that corresponds to the order of the multi-band multi-order power amplifier.

5. The system of claim 4 wherein the one or more calibration actuators of each of the digital upconverters for the N baseband split signals for each of the M frequency bands of the multi-band signal are configured to independently control the gain, phase, and delay for each of the M frequency bands of the multi-band signal for each of the plurality of multi-band split signals such that the one or more performance parameters of the multi-band multi-order power amplifier are optimized.

6. The system of claim 5 wherein the one or more performance parameters comprise efficiency and at least one of a group consisting of linearity and output power.

7. The system of claim 4 wherein the one or more calibration actuators of each of the digital upconverters for the N baseband split signals for each of the M frequency bands of the multi-band signal are configured to independently control the gain, phase, and delay for each of the M frequency bands of the multi-band signal for each of the plurality of multi-band split signals such that an efficiency of the multi-band multi-order power amplifier is maximized while maintaining sufficient linearity to satisfy one or more predefined requirements for the multi-band multi-order power amplifier.

8. The system of claim 1 wherein the digital upconversion system is configured to independently control the gain, phase, and delay for each of the M frequency bands of the multi-band signal for each of the at least N-1 of the plurality of multi-band split signals such that one or more performance parameters of the multi-band multi-order power amplifier are optimized.

9. The system of claim 8 wherein the one or more performance parameters comprise efficiency and at least one of a group consisting of linearity and output power.

10. A digital upconversion system for a multi-band multi-order power amplifier configured to amplify a multi-band signal split across a plurality of inputs of the multi-band multi-order power amplifier as a plurality of multi-band split signals, the plurality of inputs comprising a different input for each of N orders of the multi-band multi-order power amplifier where N is greater than or equal to 2 and the multi-band signal comprises M narrowband signals in M frequency bands of the multi-band signal wherein M is greater than or equal to 2, comprising:

for each frequency band of the M frequency bands of the multi-band signal:
a digital signal splitter that splits a digital baseband signal for the frequency band into N baseband split signals for the frequency band, each of the N baseband split signals for the frequency band being for a different order of the N orders of the multi-band multi-order power amplifier; and
for each baseband split signal for the frequency band of the N baseband split signals for the frequency band, a digital upconverter that upconverts the baseband split signal for the frequency band to a desired upconversion frequency to thereby provide an upconverted split signal for the frequency band, the digital upconverter comprising one or more calibration actuators configured to control a gain, phase, and delay of the upconverted split signal for the frequency band; and
circuitry configured to process the upconverted split signals for the M frequency bands of the multi-band signal for each of the N orders of the multi-band multi-order power amplifier to provide the plurality of multi-band split signals for the plurality of inputs of the multi-band multi-order power amplifier.

11. The digital upconversion system of claim 10 wherein the digital upconversion system further comprises, for each order of the N orders of the multi-band multi-order power amplifier:
a digital combiner configured to digitally combine the upconverted split signals for the M frequency bands of the multi-band signal for the order of the multi-band multi-order power amplifier to provide a combined upconverted digital signal for the order of the multi-band multi-order power amplifier; and
a digital-to-analog converter configured to digital-to-analog convert the combined upconverted digital signal for the order of the multi-band multi-order power amplifier to provide a combined upconverted analog signal for the order of the multi-band multi-order power amplifier.

12. The digital upconversion system of claim 11 wherein, for each order of the N orders of the multi-band multi-order power amplifier, the combined upconverted analog signal for the order of the multi-band multi-order power amplifier is processed by analog circuitry to provide one of the plurality of multi-band split signals for one of the plurality of inputs of the multi-band multi-order power amplifier that corresponds to the order of the multi-band multi-order power amplifier.

13. The digital upconversion system of claim 12 wherein the one or more calibration actuators of each of the digital upconverters for the N baseband split signals for each of the M frequency bands of the multi-band signal are configured to independently control a gain, phase, and delay for each of the M frequency bands of the multi-band signal for each of the plurality of multi-band split signals such that one or more performance parameters of the multi-band multi-order power amplifier are optimized.

14. The digital upconversion system of claim 13 wherein the one or more performance parameters comprise efficiency and at least one of a group consisting of linearity and output power.

15. The digital upconversion system of claim 12 wherein the one or more calibration actuators of each of the digital upconverters for the N baseband split signals for each of the M frequency bands of the multi-band signal are configured to independently control a gain, phase, and delay for each of the M frequency bands of the multi-band signal for each of the plurality of multi-band split signals such that an efficiency of the multi-band multi-order power amplifier is maximized while maintaining sufficient linearity to satisfy one or more predefined requirements for the multi-band multi-order power amplifier.

16. A method comprising:
amplifying, via a multi-band multi-order power amplifier, a multi-band signal split across a plurality of inputs of the multi-band multi-order power amplifier as a plurality of multi-band split signals, the plurality of inputs comprising a different input for each of N orders of the multi-band multi-order power amplifier where N is greater than or equal to 2; and
controlling a gain, phase, and delay for each of M frequency bands of the multi-band signal for each of at least N−1 of the plurality of multi-band split signals independently from the gains, phases, and delays of other multi-band split signals, wherein independently controlling the gain, phase, and delay for each of the M frequency bands of the multi-band signal for each of the at least N−1 of the plurality of multi-band split signals comprises:
independently and digitally controlling the gain, phase, and delay for each of the M frequency bands of the multi-band signal for each of the at least N−1 of the plurality of multi-band split signals at baseband.

17. The method of claim 16 wherein independently controlling the gain, phase, and delay for each of the M frequency bands of the multi-band signal for each of the at least N−1 of the plurality of multi-band split signals comprises:
independently controlling the gain, phase, and delay for each of the M frequency bands of the multi-band signal for each of the at least N−1 of the plurality of multi-band split signals such that one or more performance parameters of the multi-band multi-order power amplifier are optimized.

18. The method of claim 17 wherein the one or more performance parameters comprise efficiency and at least one of a group consisting of linearity and output power.

19. The method of claim 16 wherein independently controlling the gain, phase, and delay for each of the M frequency bands of the multi-band signal for each of the at least N−1 of the plurality of multi-band split signals comprises:
independently controlling the gain, phase, and delay for each of the M frequency bands of the multi-band signal for each of the at least N−1 of the plurality of multi-band split signals such that an efficiency of the multi-band multi-order power amplifier is maximized while maintaining sufficient linearity to satisfy one or more predefined requirements for the multi-band multi-order power amplifier.

20. The method of claim 16 wherein the multi-band signal comprises M narrowband signals in the M frequency bands of the multi-band signal wherein M is greater than or equal to 2, and independently controlling the gain, phase, and delay for each of the M frequency bands of the multi-band signal for each multi-band split signal of the plurality of multi-band split signals comprises, for each frequency band of the M frequency bands of the multi-band signal:
digitally splitting a digital baseband signal for the frequency band into N baseband split signals for the frequency band, each of the N baseband split signals for the frequency band being for a different order of the N orders of the multi-band multi-order power amplifier; and for each baseband split signal for the frequency band of the N baseband split signals for the frequency band, digitally upconverting the baseband split signal for the frequency band to a desired upconversion frequency to thereby provide an upconverted split signal for the frequency band;

wherein digitally upconverting the baseband split signal for the frequency band comprises controlling a gain, phase, and delay of the upconverted split signal for the frequency band.

21. The method of claim 20 further comprising, for each order of the N orders of the multi-band multi-order power amplifier:

digitally combining the upconverted split signals for the M frequency bands of the multi-band signal for the order of the multi-band multi-order power amplifier to provide a combined upconverted digital signal for the order of the multi-band multi-order power amplifier; and digital-to-analog converting the combined upconverted digital signal for the order of the multi-band multi-order power amplifier to provide a combined upconverted analog signal for the order of the multi-band multi-order power amplifier.

22. The method of claim 21 further comprising, for each order of the N orders of the multi-band multi-order power amplifier:

processing, via analog circuitry, the combined upconverted analog signal for the order of the multi-band multi-order power amplifier to provide one of the plurality of multi-band split signals for one of the plurality of inputs of the multi-band multi-order power amplifier that corresponds to the order of the multi-band multi-order power amplifier.

23. The method of claim 22 wherein controlling the gain, phase, and delay of the upconverted split signal of each of the M frequency bands of the multi-band signal for each of the N orders of the multi-band multi-order power amplifier is such that one or more performance parameters of the multi-band multi-order power amplifier are optimized.

24. The method of claim 23 wherein the one or more performance parameters comprise efficiency and at least one of a group consisting of linearity and output power.

25. The method of claim 22 wherein controlling the gain, phase, and delay of the upconverted split signal of each of the M frequency bands of the multi-band signal for each of the N orders of the multi-band multi-order power amplifier is such that an efficiency of the multi-band multi-order power amplifier is maximized while maintaining sufficient linearity to satisfy one or more predefined requirements for the multi-band multi-order power amplifier.

* * * * *

UNITED STATES PATENT AND TRADEMARK OFFICE
CERTIFICATE OF CORRECTION

PATENT NO. : 10,637,403 B2  
APPLICATION NO. : 15/398536  
DATED : April 28, 2020  
INVENTOR(S) : Morris et al.

Page 1 of 1

It is certified that error appears in the above-identified patent and that said Letters Patent is hereby corrected as shown below:

In the Specification

In Column 7, Line 2, delete "$\tau_{M-N}$)" and insert -- ($\tau_{M-N}$) --, therefor.

In Column 8, Line 36, delete "$S_{U,M-N}$)" and insert -- $S_{UP,M-N}$) --, therefor.

In Column 9, Line 52, delete "complex tuner 56" and insert -- complex tuner 52 --, therefor.

In Column 9, Line 54, delete "complex tuner 56" and insert -- complex tuner 52 --, therefor.

In Column 11, Line 22, below "MOPA Multi-Order Power Amplifier" insert -- RCF Rate Change Filter -- as a new sub point.

Signed and Sealed this  
First Day of September, 2020

Andrei Iancu  
*Director of the United States Patent and Trademark Office*